(12) United States Patent
Delaney et al.

(10) Patent No.: US 7,795,983 B1
(45) Date of Patent: Sep. 14, 2010

(54) CHAOTIC SIGNAL ENABLED LOW PROBABILITY INTERCEPT COMMUNICATION

(75) Inventors: Michael J. Delaney, Thousand Oaks, CA (US); Jose M. Cruz-Albrecht, Oak Park, CA (US); Joseph F. Jensen, Camarillo, CA (US); Keh-Chung Wang, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 931 days.

(21) Appl. No.: 11/646,176

(22) Filed: Dec. 26, 2006

(51) Int. Cl.
*H03B 29/00* (2006.01)
(52) U.S. Cl. ..................... 331/78; 331/117 R; 331/167
(58) Field of Classification Search ................ 331/78, 331/17 R, 167
See application file for complete search history.

(56) References Cited

U.S. PATENT DOCUMENTS

| | | | | |
|---|---|---|---|---|
| 6,127,899 | A * | 10/2000 | Silva et al. | 331/78 |
| 7,098,746 | B2 * | 8/2006 | Heijden et al. | 331/78 |
| 2003/0007638 | A1 * | 1/2003 | Carroll | 380/263 |
| 2010/0005128 | A1 * | 1/2010 | Ergun | 708/251 |

OTHER PUBLICATIONS

Jose M. Cruz, et al., "A CMOS IC Nonlinear Resistor for Chua's Circuit," *IEEE Transactions on Circuits and Systems—I: Fundamental Theory and Applications*, Dec. 1992, pp. 985-995, vol. 39, No. 12, IEEE.

Jose M. Cruz, et al., "An IC Chip of Chua's Circuit," *IEEE Transactions on Circuits and Systems—II: Analog and Digital Signal Processing*, Oct. 1993, pp. 614-625, vol. 40, No. 10, IEEE.

* cited by examiner

*Primary Examiner*—Joseph Chang
(74) *Attorney, Agent, or Firm*—Christie, Parker, Hale

(57) ABSTRACT

A circuit for generating chaotic signals implemented using heterojunction bipolar transistors (HBTs) and utilized in low probability intercept communications. The HBT chaotic circuit generates truly random analog signals in the GHz range that are non-repeating and deterministic and may not be replicated by preloading a predetermined sequence. A fully differential autonomous chaotic circuit outputs two pairs of chaotic signals to be used in a communication system. As it is impossible to generate identical chaotic signals at the transmitter and receiver sites, the receiver itself sends the chaotic signal to be used for encoding to the transmitter. The receiver includes a chaotic signal generator and digitizes, upconverts, and transmits the generated chaotic signal to the transmitter. The transmitter uses the received chaotic signal to code data to be transmitted. The receiver decodes the transmitted data that is encoded by the chaotic signal to retrieve the transmitted data.

7 Claims, 23 Drawing Sheets

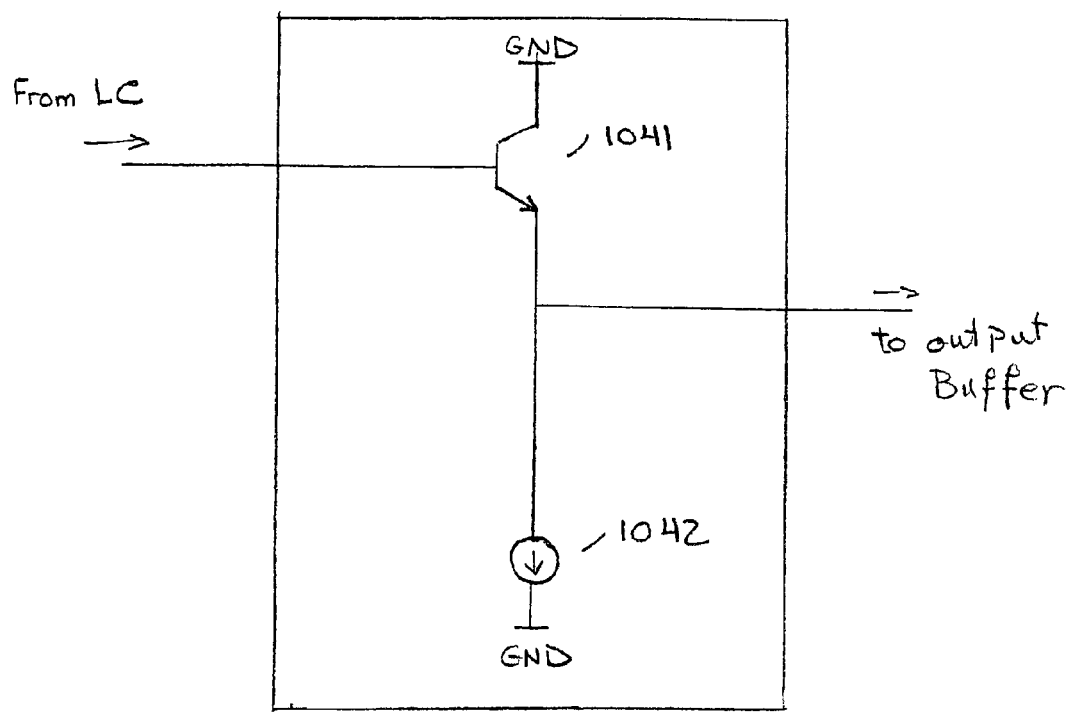

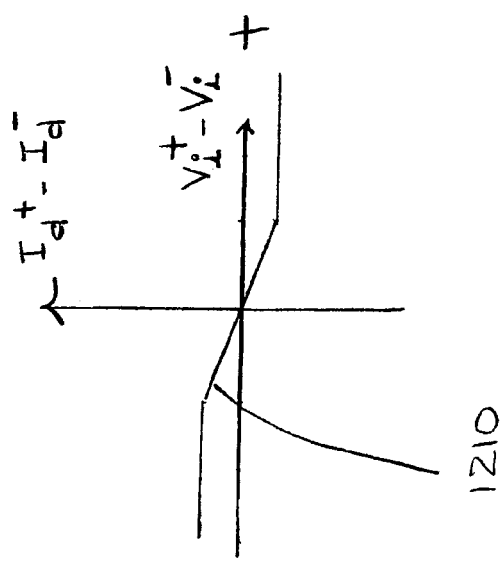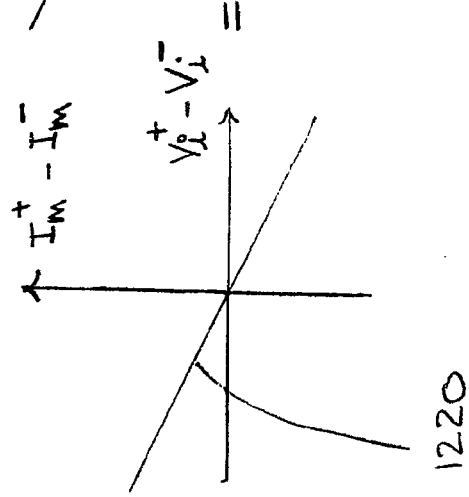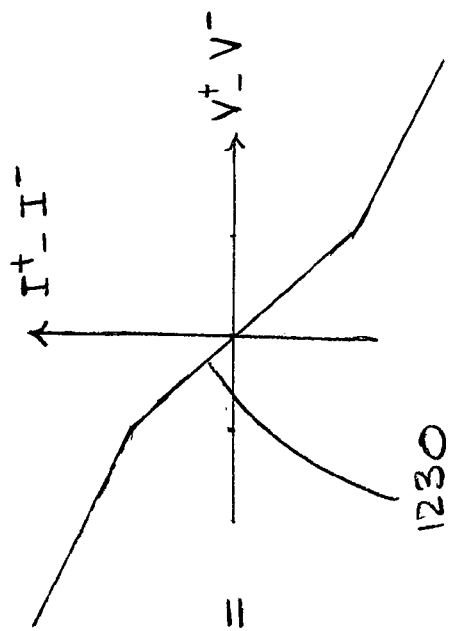

CHAOTIC SIGNAL ENABLED LOW PROBABILITY INTERCEPT COMMUNICATION

BACKGROUND OF THE INVENTION

1. Field of the Invention

This invention relates to secured communication, such as links for commercial financial data and company confidential information, and, more particularly, to using a random signal to modulate the amplitude and phase of an RF carrier to enable a low probability of intercept for the communication.

2. Description of Related Art

Conventional secured communications use pseudo-random bit sequences (PRBSs) to encode data. The sequence repeats itself after a finite bit length. The sequence can be detected and synchronized. The encoded data can thus be decoded and extracted by advanced eavesdroppers.

Current low-probability intercept (LPI) communications in airborne, space-borne, and terrestrial vehicles and stations use PRBSs to modulate or scramble transmitting waveforms. The PRBS is not a true random bit sequence. It repeats itself after a fixed bit length. The PRBS is pseudorandom because, unlike truly random sequences, it is deterministic and after a certain number of bits or elements the sequence starts to repeat itself. Truly random sequences, such as sequences generated by radioactive decay or by white noise, do not have a period and do not repeat.

FIG. 1 is a schematic diagram of a PRBS system. A PRBS generator 10 is used to generate a PRBS 20. The PRBS generator 10 receives power from power supply 15 for its various internal elements, such as transistors, and a control signal 17, such as a transistor gate voltage, to begin the generation of the pseudorandom sequence. The PRBS 20 repeats itself after a period 25 that is denoted as T. Because the PRBS 20 is not a truly random bit sequence it may be decoded. The PRBS modulated LPI waveforms are thus susceptible to intercept by an eavesdropper equipped with advanced receivers and analysis algorithms.

Therefore, there is a need for a truly secured communication via optical fiber or wireless that prevents the eavesdroppers from decoding and extracting the data being communicated.

SUMMARY OF THE INVENTION

Embodiments of the present invention modulate the communication waveforms with a sequence of non-recurrence truly chaotic analog signals. Such chaotic signals can not be replicated by pre-loading a pre-determined sequence. It is impossible to generate identical chaotic signals at the transmitter and receiver sites. Embodiments of the invention, therefore, overcome the security problem associated with conventional communications.

Embodiments of the present invention provide a method for communicating data from a transmitter to a receiver. The method includes generating an analog chaotic signal at the receiver, storing the chaotic signal at the receiver to obtain a stored chaotic signal, generating a receiver signal from the chaotic signal, sending the receiver signal from the receiver to the transmitter, receiving the receiver signal at the transmitter, generating an encoding signal from the receiver signal, encoding the data using the encoder signal to generate encoded data, generating a transmitter signal from the encoded data, transmitting the transmitter signal from the transmitter to the receiver, receiving the transmitter signal at the receiver, generating a data signal from the transmitter signal, and decoding the data signal using the stored chaotic signal to extract the data. The chaotic signal is a non-repeating deterministic chaotic signal that is unreplicatable by preloading a predetermined sequence. The chaotic signal is generated by an autonomous fully differential chaotic circuit implemented using HBT type transistors and passive inductors and capacitors.

Embodiments of the present invention also provide an autonomous chaotic circuit that has a first pair of circuit output terminals and a second pair of circuit output terminals and is fully differential. The autonomous chaotic circuit includes a first circuit that has a pair of first input terminals and a pair of first output terminals. The pair of first input terminals are coupled to the first pair of circuit output terminals in a positive feedback configuration. The autonomous chaotic circuit also includes a multiplier circuit coupled to the first circuit in a positive feedback configuration. The multiplier circuit has a pair of multiplier input terminals and a pair of multiplier output terminals. The pair of multiplier input terminals that are coupled to the pair of first input terminals, and the pair of multiplier output terminals that are coupled to the pair of first output terminals form a first pair of common output terminals that include a first common output terminal and a second common output terminal. The autonomous chaotic circuit also includes a first LC circuit and a second LC circuit. The first LC circuit has a first inductor that is coupled to a first capacitor in parallel. The first LC circuit is coupled to a reference voltage at one terminal. The second LC circuit has a second inductor coupled to a second capacitor in parallel. The second LC circuit is coupled to the reference voltage at one terminal. The autonomous chaotic circuit also includes a first resistor and a second resistor. The first resistor is coupled between the first LC circuit and the first common output terminal and a node between the first resistor and the first LC circuit is a third common output terminal. The second resistor is coupled between the second LC circuit and the second common output terminal and a node between the second resistor and the second LC circuit is a fourth common output terminal. The third common output terminal and the fourth common output terminal form a second pair of common output terminals. The first circuit and the multiplier circuit are implemented using HBT. The first inductor, the second inductor, the first capacitor, and the second capacitor are implemented by passive inductors and passive capacitors.

In one embodiment, the autonomous chaotic circuit includes HBT transistors implementing first circuit and the multiplier circuit that have a cutoff frequency of substantially 200 GHz. The first resistor and the second resistor each have a resistance of substantially 130Ω. The first inductor and the second inductor each have an inductance of substantially 2.5 µH. The first capacitor and the second capacitor each have a capacitance of substantially 2.75 pF. The first circuit includes a current source producing a current of substantially 1.6 mA, and the multiplier circuit includes a current source producing a current of substantially 5.1 mA.

Embodiments of the present invention also provide a method for autonomous and differential generation of a pair of chaotic signals. The method includes generating a differential pair of currents by supplying a differential control voltage and positive feed back to a circuit implementing a negative resistance having nonlinear input-output characteristics, generating resonance by providing the differential pair of currents to a pair of parallel LC circuits through a pair of resistors, obtaining a first chaotic signal from a differential pair of voltages output by the negative resistance circuit at nodes before the pair of resistors, and obtaining a second chaotic signal from the differential pair of voltages output by the negative resistance circuit at nodes after the pair of resistors. The negative resistance circuit includes a parasitic capacitance in parallel with the other elements of the negative resistance circuit, and the resonance generated is substantially in the GHz range.

BRIEF DESCRIPTION OF THE DRAWINGS

FIG. 11D shows the internal components of an emitter follower circuit shown in FIG. 10.

FIGS. 12A and 12B show the differential voltage versus differential current outputs of the components of the chaotic circuit of FIG. 10.

FIG. 12C shows the differential voltage versus differential current outputs of the overall chaotic circuit of FIG. 10.

DETAILED DESCRIPTION OF THE INVENTION

The embodiments of the invention present a new scheme of low-probability intercept (LPI) communication, using non-recurring chaotic signals. In this scheme, the data receiver sends out a digitalized chaotic signal sequence to the data transmitter. The transmitter uses it to encode data to be sent. In the meanwhile, the receiver stores the digital chaotic signal. After receiving "returned" and encoded signal from the transmitter and with a proper synchronization, the receiver decodes the signal to extract data. In one embodiment, design and simulation of the analog chaotic signal generator is based on Indium Phosphide hetero-junction bipolar transistors (InP HBTs).

Figure 1:
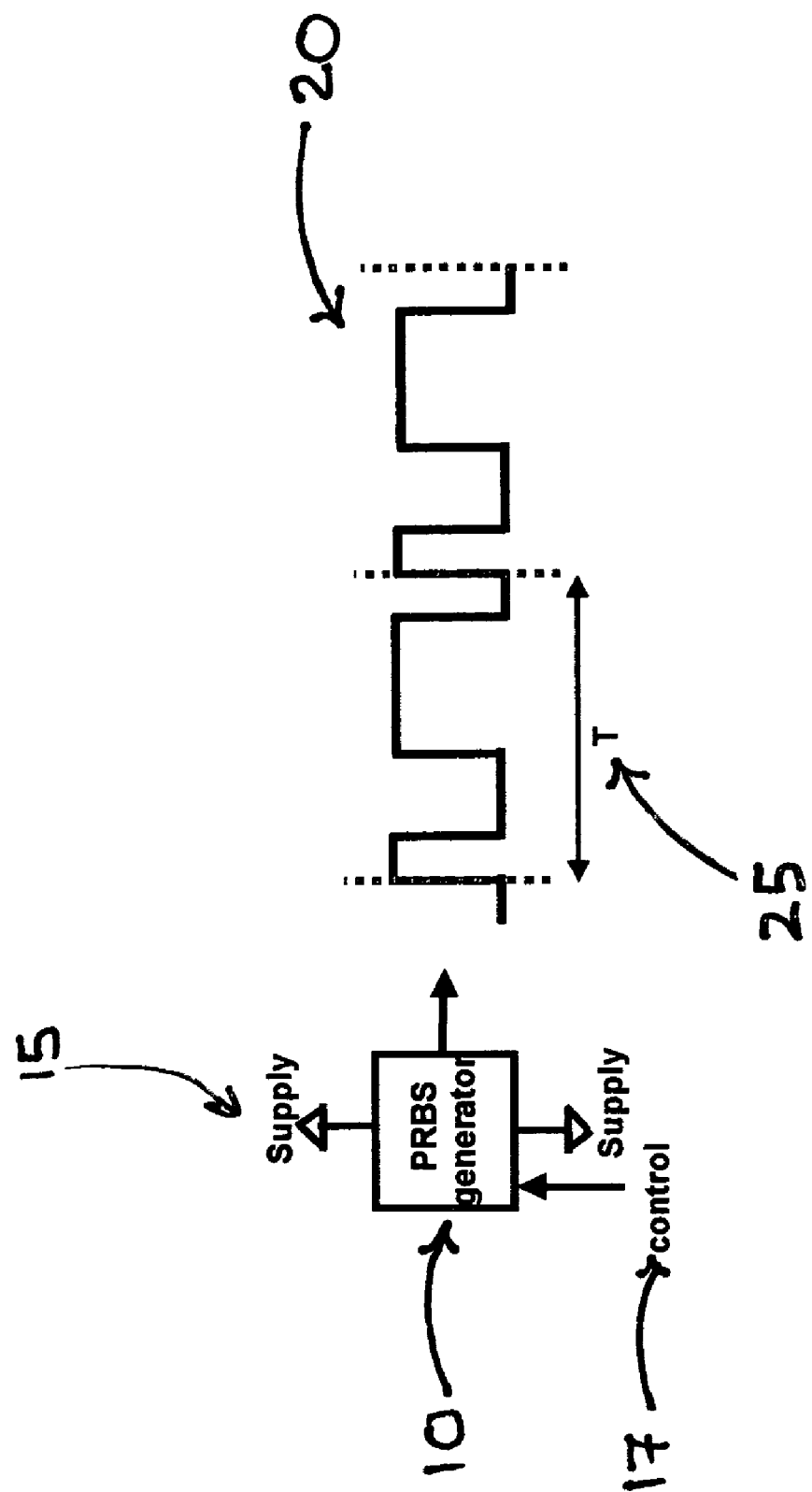
FIG. 1 is a schematic diagram of a PRBS system.
Figure 2:
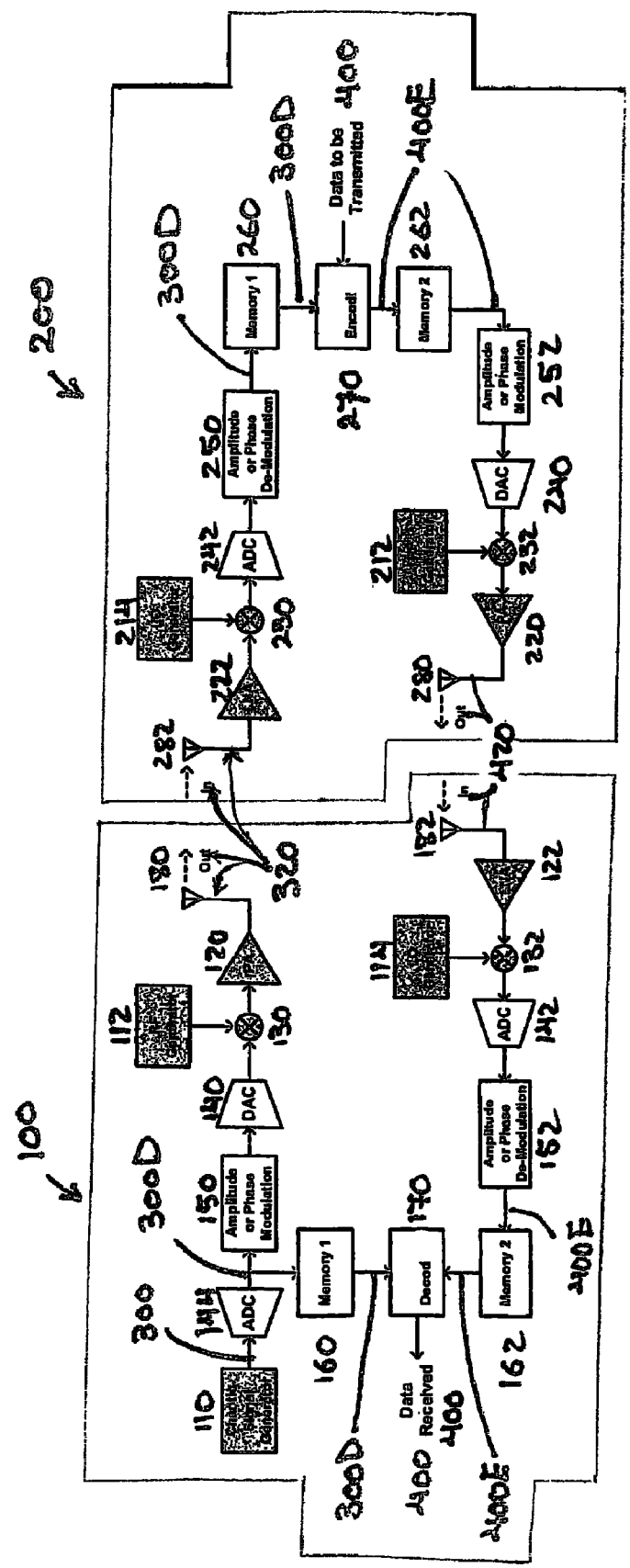
FIG. 2 shows a chaotic signal enabled LPI communication system according to the embodiments of the invention.

FIG. 2 shows a chaotic signal enabled LPI communication system according to the embodiments of the invention. A non-recurrence analog chaotic signal generation scheme is shown in FIG. 2. The scheme of FIG. 2 includes a receiver 100 and a transmitter 200. The receiver 100 generates a chaotic signal 300 and sends a modulated and up-converted version of the chaotic signal 300 to the transmitter 200. The transmitter 200 extracts the chaotic signal 300 from the received signal to encode a baseband data 400 to be transmitted. Encoded data 400E is sent back to the receiver 100. The receiver 100 extracts the baseband data 400 that was transmitted from the encoded data 400E that is received.

The components of exemplary embodiments of the receiver 100 and the transmitter 200 are shown in FIG. 2.

The receiver 100 includes a chaotic signal generator 110, a receiver RF signal generator 112, a receiver local oscillator signal generator 114, a receiver power amplifier 120, a receiver low noise amplifier 122, receiver first and second mixers 130, 132, receiver digital to analog converter 140, receiver analog to digital converter 142, receiver amplitude or phase modulator 150, receiver amplitude or phase demodulator 152, receiver first and second memories 160, 162, a receiver data decoder 170, a receiver sending antenna 180, and a receiver receiving antenna 182.

The transmitter 200 includes a transmitter RF signal generator 212, a transmitter local oscillator signal generator 214, a transmitter power amplifier 220, a transmitter low noise amplifier 222, transmitter first and second mixers 230, 232, transmitter digital to analog converter 240, transmitter analog to digital converter 242, transmitter amplitude or phase demodulator 250, transmitter amplitude or phase modulator 252, transmitter first and second memories 260, 262, a transmitter data decoder 270, a transmitter sending antenna 280, and a transmitter receiving antenna 282.

The analog chaotic signal 300 is generated by the chaotic signal generator 110. The analog to digital converter 144 converts this analog signal into a digital signal 300D that is sent to both the modulator 150 and the first memory 160. The digital signal 300D sent to the first memory 160 is later used for decoding the encoded data 400E by the data decoder 170. The digital chaotic signal 300D sent to the modulator 150 is modulated and passed on to the digital to analog converter 140 to produce a corresponding modulated analog signal. The modulated analog signal is mixed in the first mixer 130 with an RF signal generated by the RF signal generator 112 to be upconverted to a higher frequency and to produce a modulated RF analog signal. The modulated RF analog signal is amplified in the power amplifier 120 to produce a transmitted chaotic signal 320 before being transmitted through the sending antenna 180.

The transmitted chaotic signal 320 is received by the receiving antenna 282 of the transmitter, passed through the low noise amplifier 222, down-converted by mixing in the first mixer 230 with a signal from local oscillator 214, converted to a digital signal by the analog to digital converter 242, demodulated by the demodulator 250 to recover the digital chaotic signal 300D that is sent to the first memory 260. The digital chaotic signal 300D is then used by the data encoder 270 to encode the data to be transmitted 400 and produce the encoded data 400E.

The encoded data 400E is stored in the second memory 262 before being sent to the modulator 252 that modulates either the phase or the amplitude of the encoded data 400E. The encoded data, that has been modulated, is sent to the digital to analog converter 240 to be converted into an analog form before being mixed in the mixer 232 with an RF signal from the RF signal generator 212. The encoded data, that has been modulated and mixed, is amplified by the power amplifier 220 before being transmitted by the antenna 280 as a transmitted encoded data 420.

At the receiver 100, the receiving antenna 182 receives the transmitted encoded data 420. The transmitted encoded data 420 is then passed through the low noise amplifier 122, down-converted by being mixed in the mixer 132 with a signal from the local oscillator 114, converted to a digital signal by the analog to digital converter 142, and demodulated by the demodulator 152, to recover the encoded data 400E. The encoded data 400E is stored in the second memory 162 to be used by the decoder 170. The decoder 170, uses the digital chaotic signal 300D from the first memory 160 and the encoded data 400E from the second memory 162 to retrieve the data that was transmitted 400.

The encoder 270 of the transmitter 200, had used the digital chaotic signal 300D that had been stored in the first memory 260 to encode the data to be transmitted 400 and produce the encoded data 400E. The decoder 170 of the receiver 100, also uses the digital chaotic signal 300D that the receiver 100 had itself initially provided to the transmitter 200 for the encoding, to decode the encoded data 400E.

The chaotic signal 300 or its digitized version 300D cannot be reproduced by eavesdroppers. The encoding mechanism, therefore remains secure.

In short, the embodiments of the invention use the chaotic signal to modulate the amplitude or the phase of an RF carrier at the receiver side. The modulated carrier is sent to the data transmitter. The data transmitter de-modulates the carrier and extracts the chaotic signal in digital format. It then encodes the data to be transmitted using the chaotic signal. The results are modulated and transmitted to the receiver. The chaotic signal is also stored in a memory at the receiver side. The returned RF signal is received, down converted, digitized and demodulated. A data decoding is then carried out to extract the real data sent by the transmitter.

One embodiment of the analog chaotic signal generator was designed based on Indium Phosphide hetero-junction bipolar transistors (InP HBTs) and validated using with SPICE simulations. In one embodiment, the invention requires only one chaotic signal generator.

Figure 3:
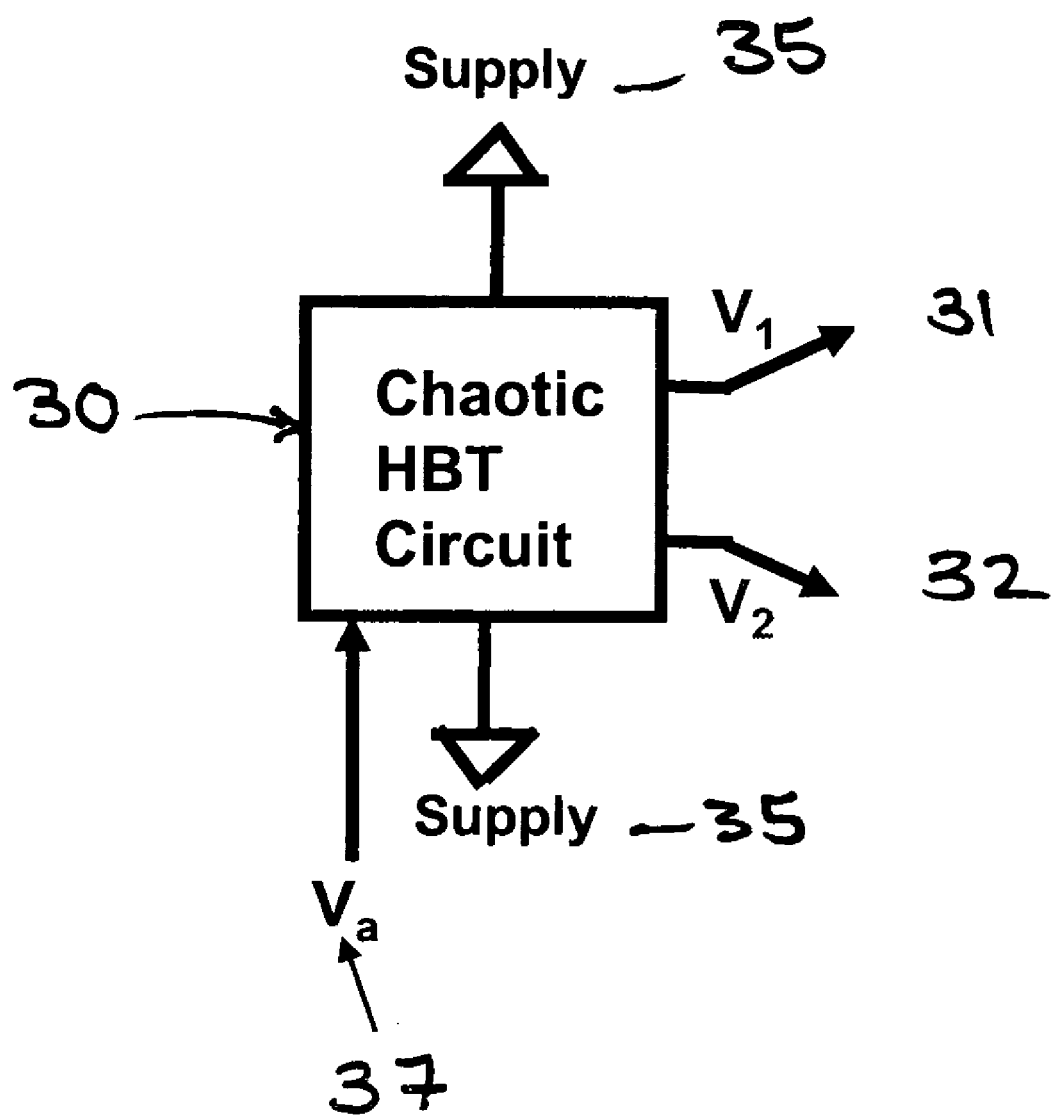
FIG. 3 shows a schematic concept of a chaotic HBT circuit for generating random waveforms according to the embodiments of the invention.

FIG. 3 shows a schematic concept of a chaotic HBT circuit 30 for generating random waveforms according to the embodiments of the invention.

The chaotic HBT circuit 30 receives power from power supply 35 for its various components. The HBT circuit 30 is autonomous and does not require any AC input signal. A control analog DC bias 37 denoted as Va is also an input to the HBT circuit 30 to change the desired dynamical behavior of the HBT circuit 30. The dynamic behavior of the HBT circuit 30 may be controlled by the control bias 37 to generate waveforms that vary from periodic to chaotic. The operation of the HBT circuit 30 is fully differential such that two output waveforms 31, 32 are generated by the circuit that are denoted as V1 and V2. When the HBT circuit 30 is operating in the chaotic range and is producing chaotic waveforms 31, 32, either one of the two generated waveforms 31, 32 is sufficient for encoding a data to be transmitted. The chaotic HBT circuit 30 of FIG. 3 may be used as the chaotic signal generator 110 of the receiver 100 in FIG. 2.

Figure 4A:
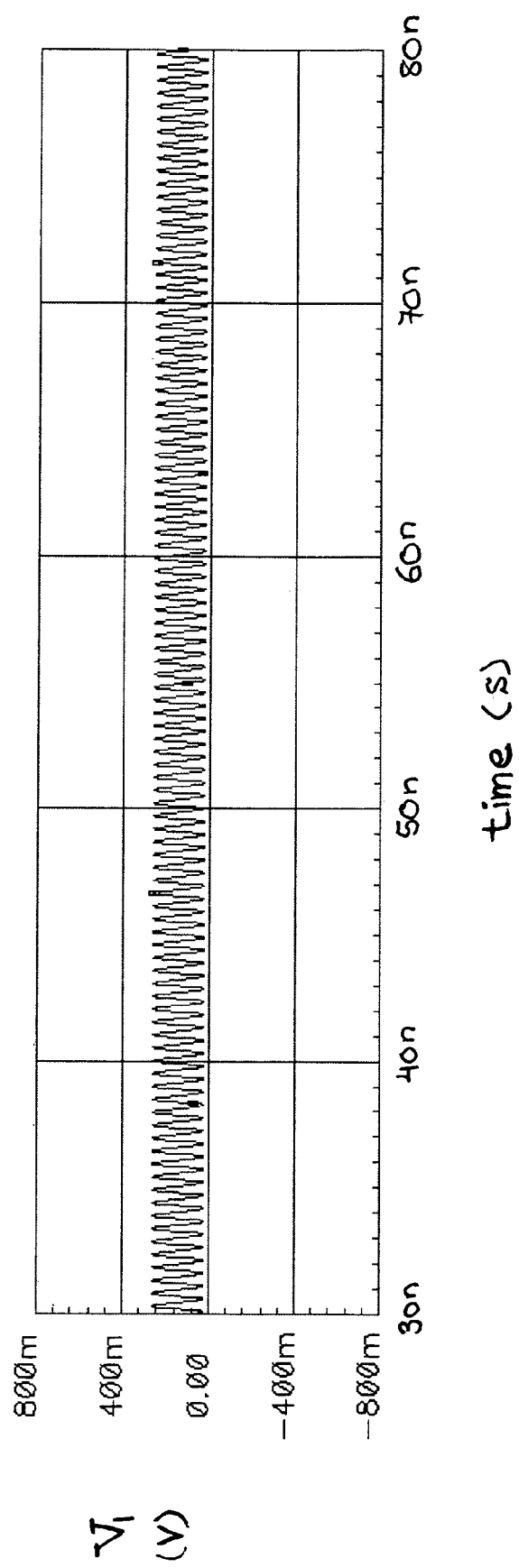
FIGS. 4A and 4B show the simulated waveforms produced by the chaotic HBT circuit of FIG. 3, when operating in the periodic range.
Figure 4B:
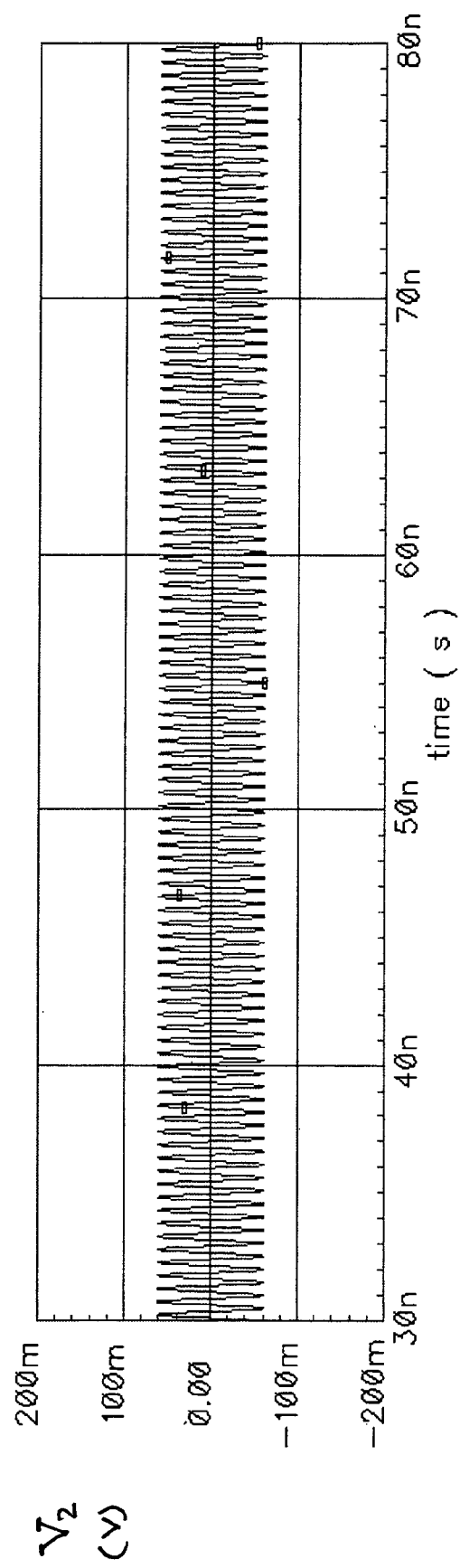
Figure 4C:
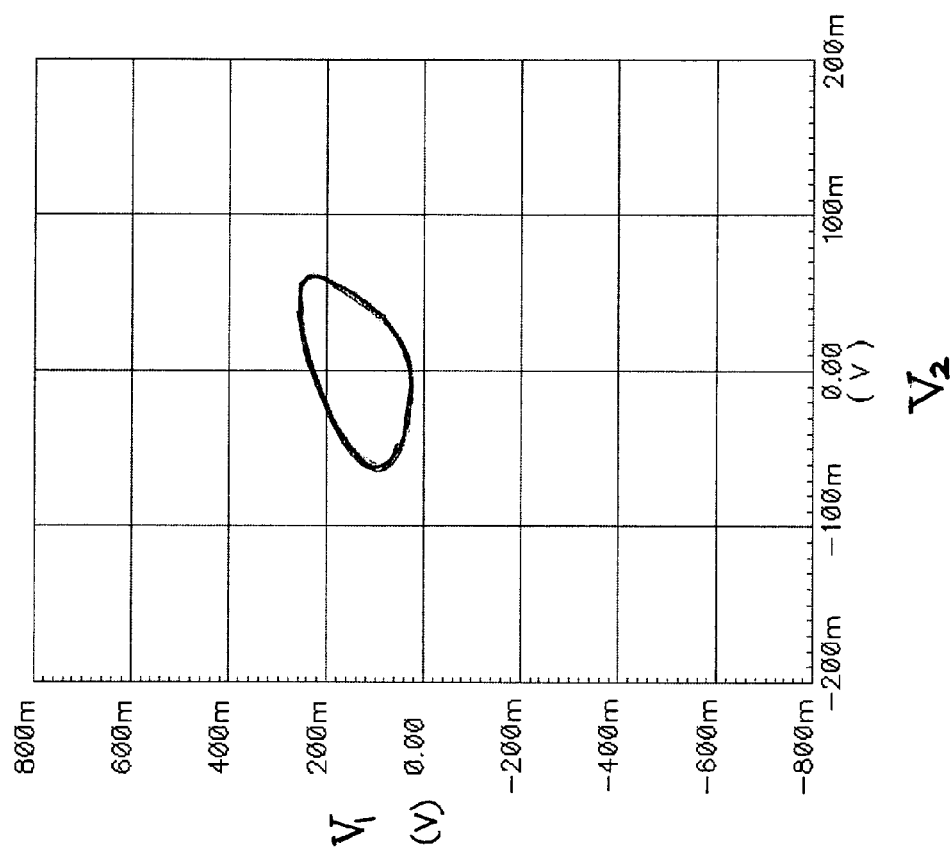
FIG. 4C shows a phase portrait of the waveforms of FIGS. 4A and 4B.

FIGS. 4A and 4B show the simulated waveforms V1 and V2 produced by the chaotic HBT circuit 30 of FIG. 3, when operating in the periodic range. A phase portrait showing a trajectory of V1 versus V2 is shown in FIG. 4C.

As explained above both waveforms for V1 and V2 are simultaneously generated due to the differential character of the chaotic circuit 30. The first simulated waveform V1 is shown versus time in FIG. 4A. The second waveform V2 is shown versus time in FIG. 4B. Both figures show the waveforms in units of volts and the time in units of seconds. In the phase portrait of FIG. 4C, both waveforms V1 and V2 are expressed in units of volts. The exemplary waveforms shown in FIGS. 4A and 4B were generated by the chaotic HBT circuit 30 when a bias voltage 37 of 710 mV was applied to the circuit. The periodic behavior of the output waveforms V1 and V2 is apparent from FIGS. 4A and 4B. Further, the trajectory plot in FIG. 4C shows a closed trajectory that is indicative of periodic behavior.

Figure 5:
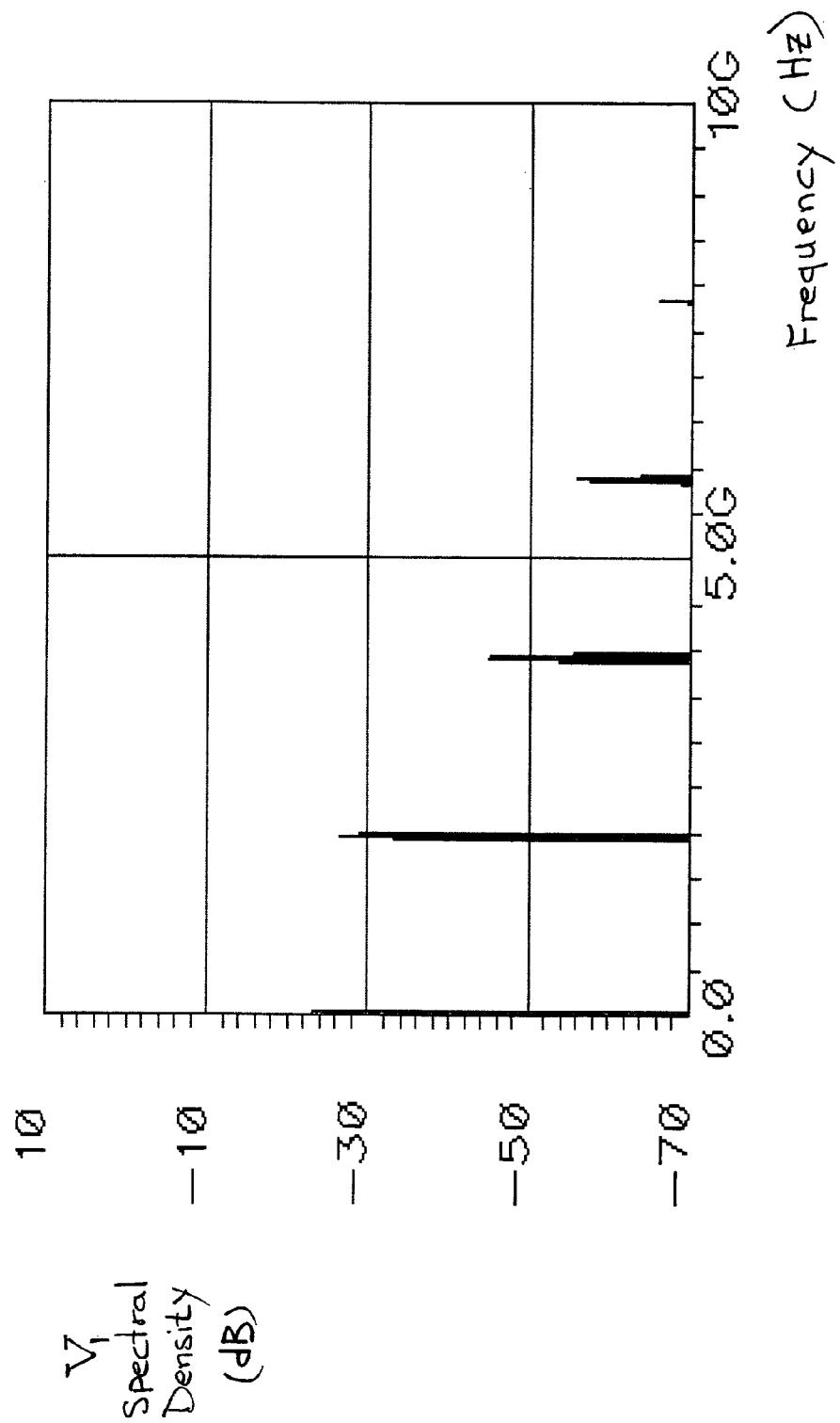
FIG. 5 shows spectral density of a first waveform shown FIG. 4A.

FIG. 5 shows a plot of the spectral density of the first waveform V1 of FIG. 4A generated during periodic operation of the chaotic HBT circuit 30. Spectral density is the Fourier transform of the autocorrelation function which indicates the periodicity of the function. Functions that repeat themselves with time have discrete Fourier transforms including delta functions occurring at the frequency of the repetition of the function or the inverse of the period of the function. In FIG. 5, the spectral density of the first waveform V1 is plotted in dB versus frequency in Hz. As the spectral density plot indicates, fundamental oscillation occurs approximately at 2 GHz. Further, as seen in plot the spectral density of the first waveform V1 includes components only at the fundamental frequency and the harmonics of the fundamental frequency. There are no frequency components below the fundamental frequency. The discrete frequency spectrum further indicates a periodic behavior.

Figure 6A:
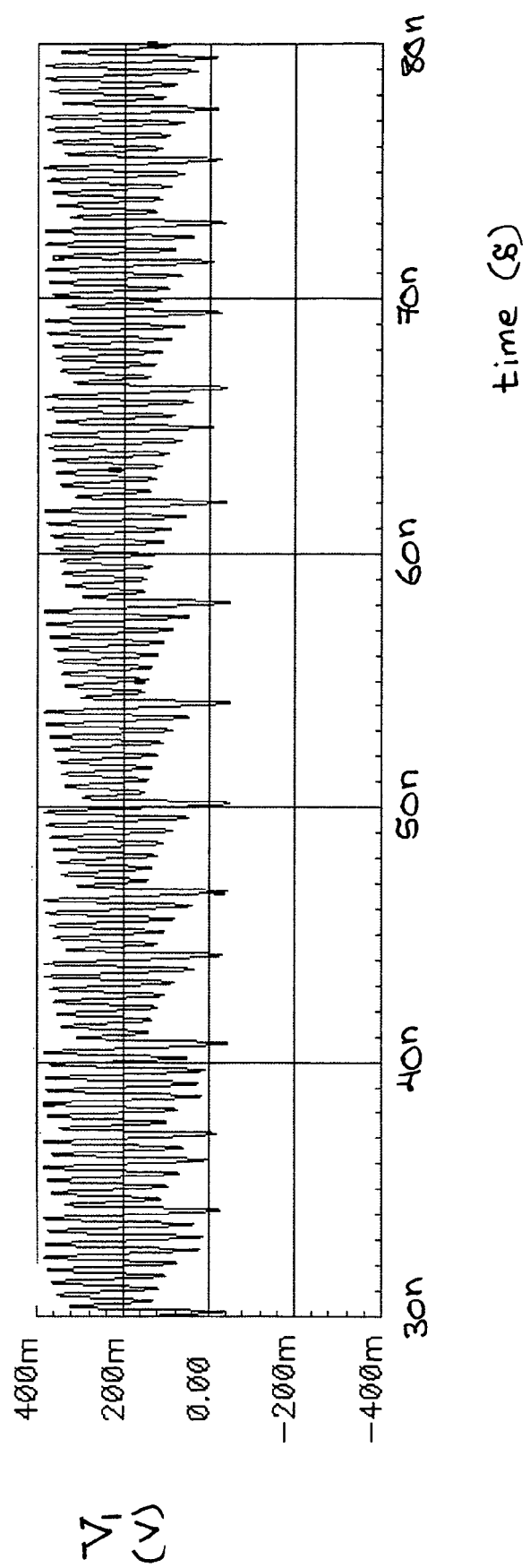
FIGS. 6A and 6B show the simulated waveforms produced by the chaotic HBT circuit 30 of FIG. 3, when operating in the chaotic range.
Figure 6B:
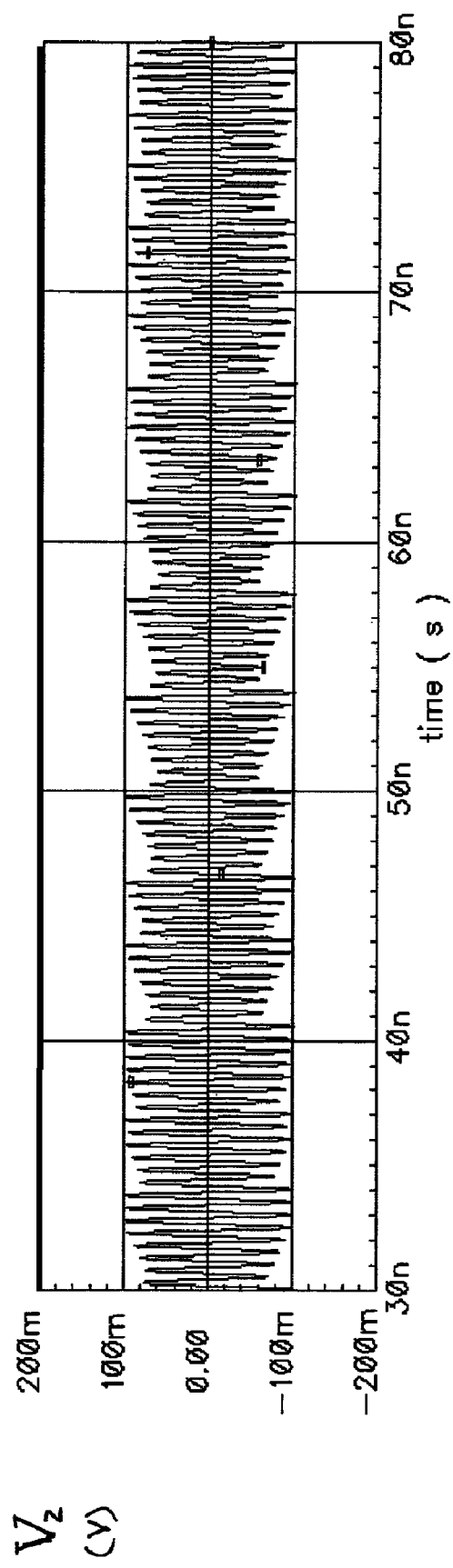
Figure 6C:
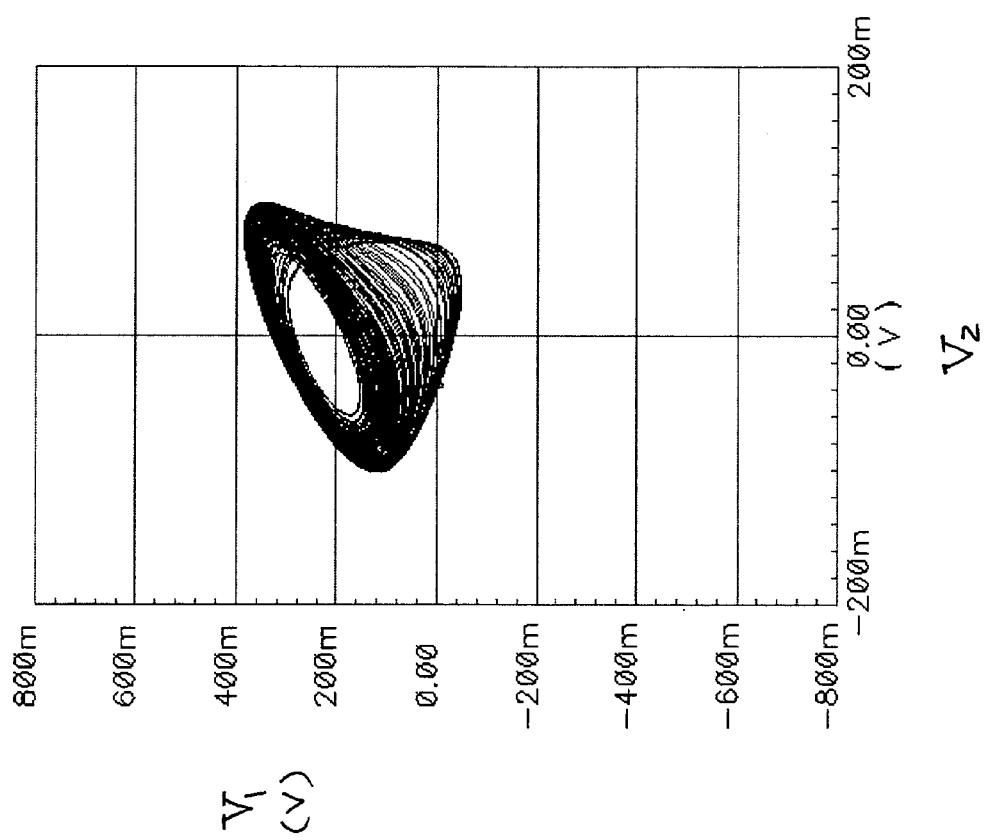
FIG. 6C shows a phase portrait of the waveforms of FIGS. 6A and 6B.

FIGS. 6A and 6B show plots of the simulated waveforms V1 and V2 produced by the chaotic HBT circuit 30 of FIG. 3, when operating in the chaotic range. A phase portrait showing a trajectory of V1 versus V2 is shown in FIG. 6C.

The first simulated waveform V1 is plotted versus time in FIG. 6A. The second waveform V2 is plotted versus time in FIG. 6B. Both plots show the waveforms in units of volts and the time in units of seconds. In the phase portrait of FIG. 6C, both waveforms are expressed in units of volts. The exemplary waveforms shown in FIGS. 6A and 6B were generated by the chaotic HBT circuit 30 when a bias voltage 37 of 730 mV was applied to the circuit. The trajectory plot of FIG. 6C shows a non-repeating trajectory in a finite space. The non-repeating trajectory of FIG. 6C is indicative of the chaotic behavior of the output waveforms V1 and V2 of FIGS. 6A and 6B.

Figure 7:
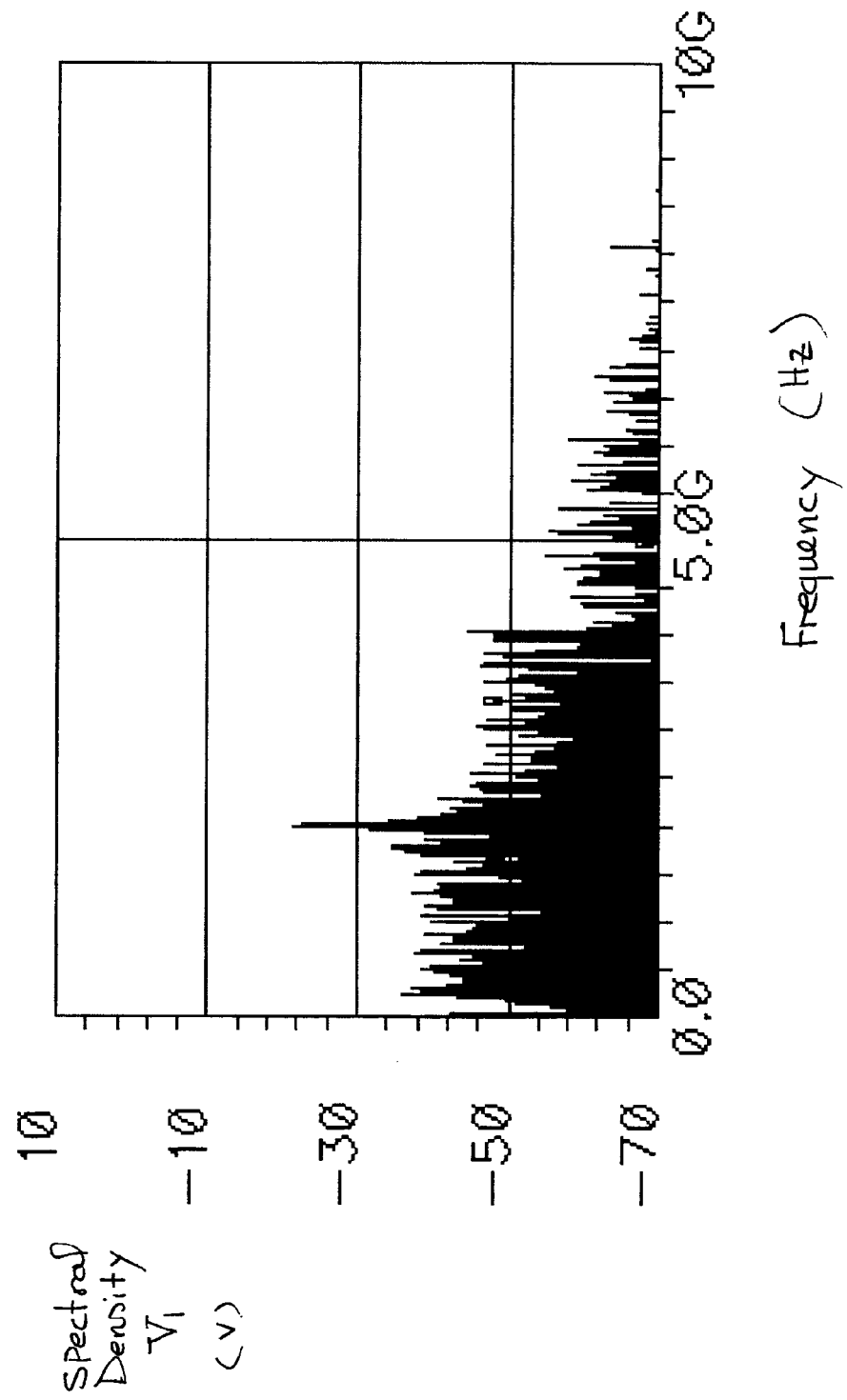
FIG. 7 shows spectral density of a first waveform shown in FIG. 6A.

FIG. 7 shows spectral density of the first waveform V1 shown FIG. 6A generated during chaotic operation of the chaotic HBT circuit 30. The spectral density of the first waveform V1 is plotted in dB versus frequency in Hz. As the spectral density plot indicates, the spectral density of the first waveform V1 includes components at most frequencies below 7 GHz. The spectrum plot is quasi-flat in the 0-2 GHz band. The quasi-flat frequency spectrum further indicates a chaotic behavior.

Figure 8A:
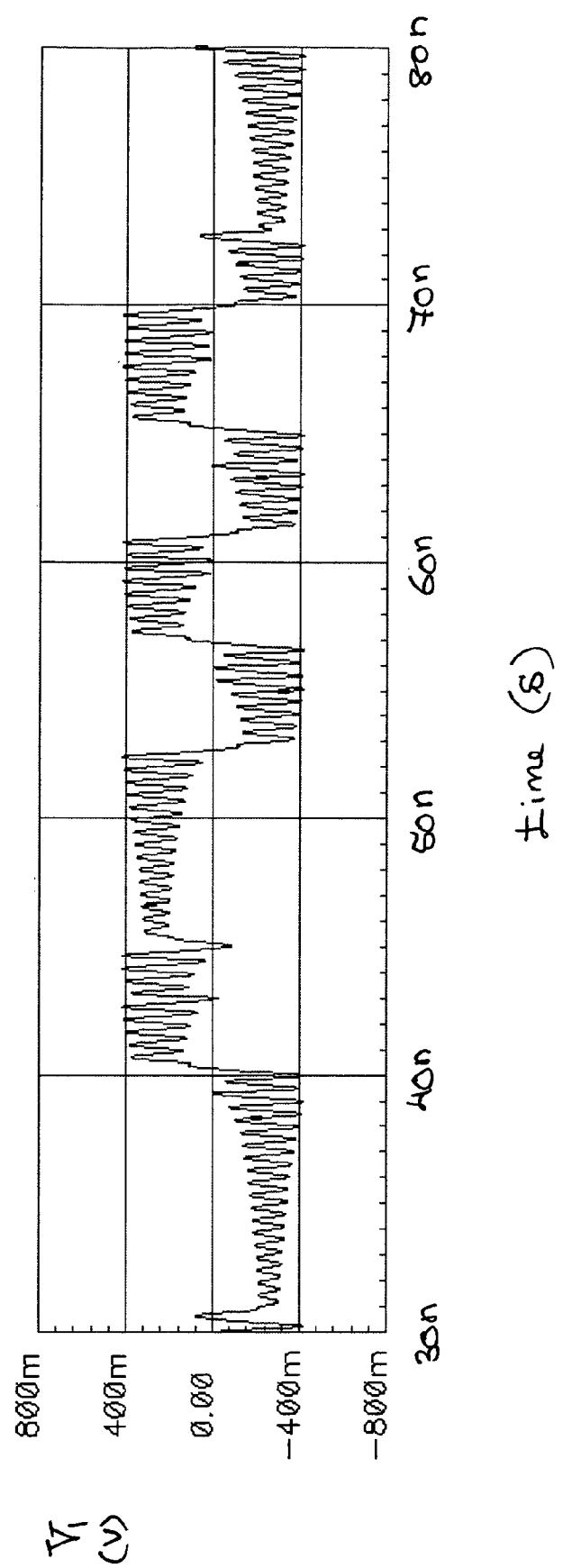
FIGS. 8A and 8B show another example of the simulated waveforms produced by the chaotic HBT circuit 30 of FIG. 3, when operating in the chaotic range.
Figure 8B:
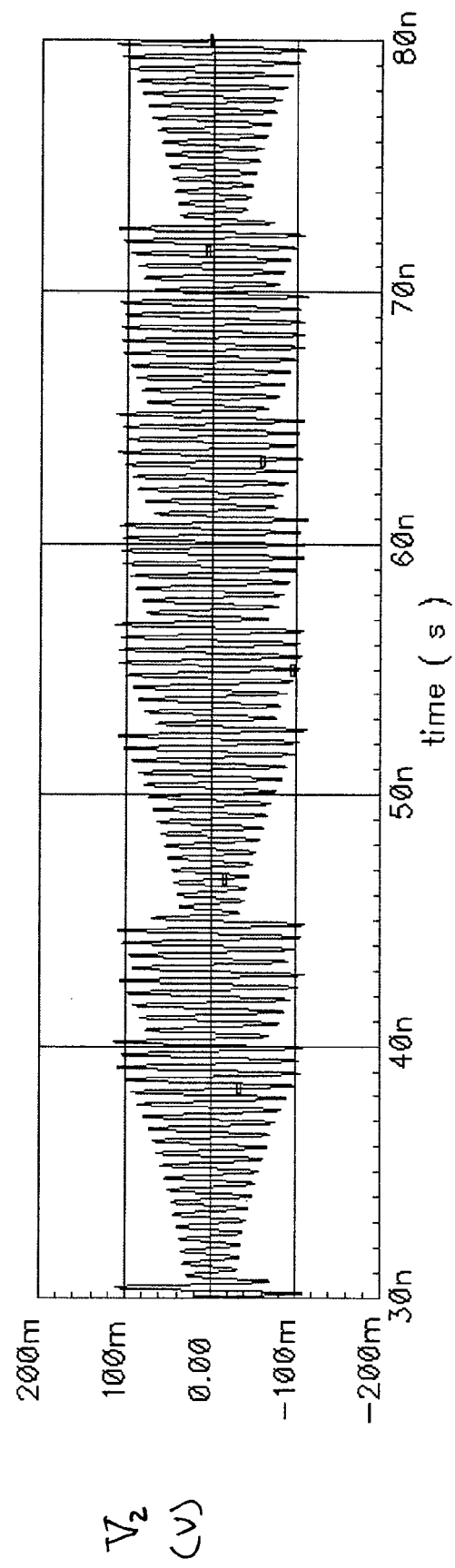

FIGS. 8A and 8B show another example of the simulated waveforms V1 and V2 produced by the chaotic HBT circuit 30 of FIG. 3, when operating in the chaotic range. A phase portrait showing a trajectory of V1 versus V2 is shown in FIG. 8C.

The first and second simulated waveforms V1 and V2 are plotted versus time. The exemplary waveforms shown in plots 810 and 820 were generated by the chaotic HBT circuit 30 when a bias voltage 37 of 735 mV was applied to the circuit.

Figure 8C:
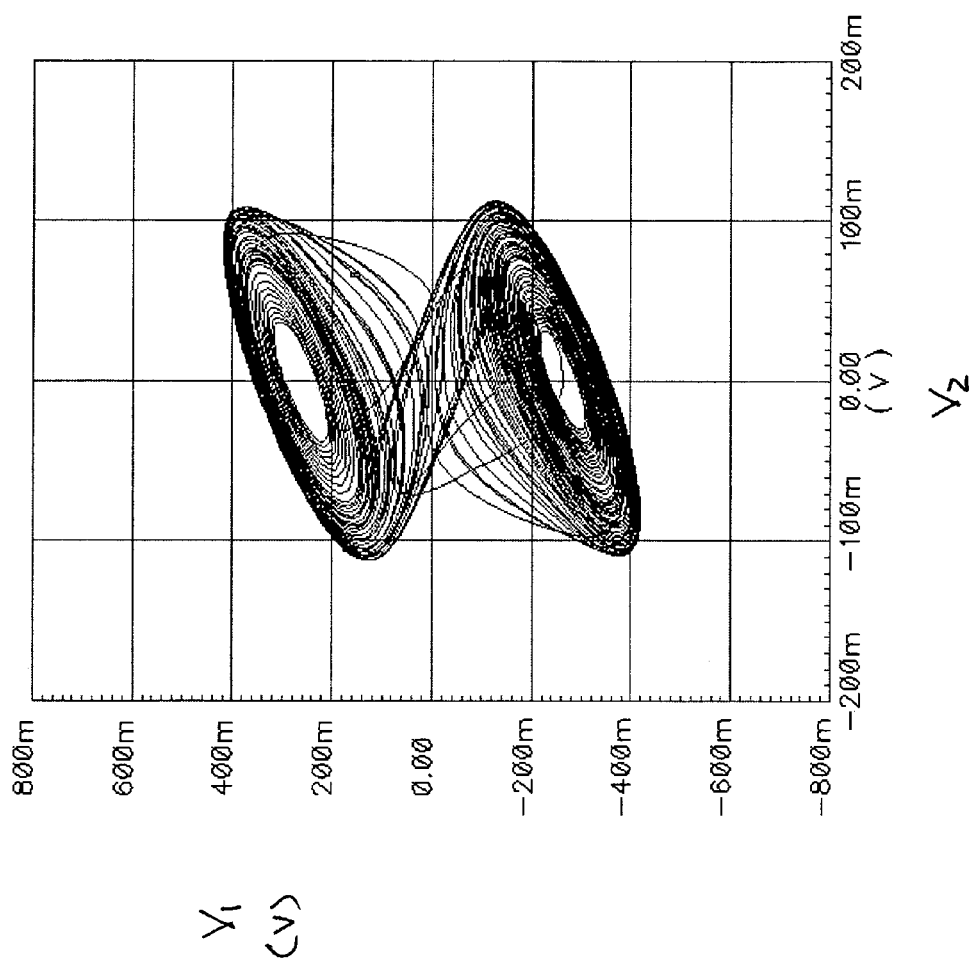
FIG. 8C shows a phase portrait of the waveforms of FIGS. 8A and 8B.

The phase portrait of FIG. 8C shows a non-repeating trajectory in a finite space with two regions that is indicative of the chaotic behavior.

Figure 9:
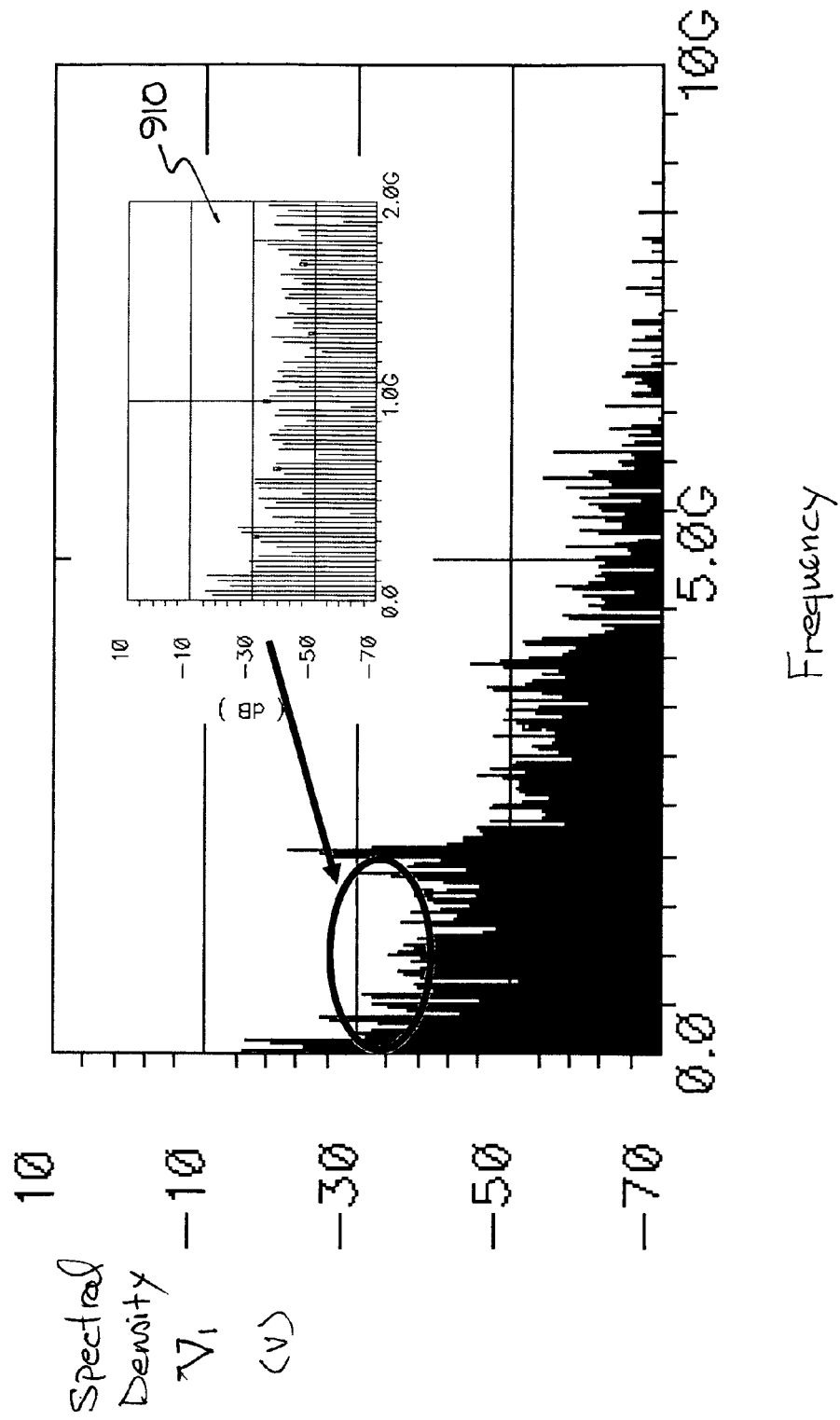
FIG. 9 shows spectral density of a first waveform shown in FIG. 8A.

FIG. 9 shows spectral density of the first waveform V1 shown FIG. 8A generated during chaotic operation of the chaotic HBT circuit 30. The spectral density of the first waveform V1 is plotted in dB versus frequency in Hz. The spectrum plot is quasi-flat in the 0-2 GHz band. An enlarged inset 910 focuses on the 0-2 GHz range to more clearly show the quasi-flat nature of the spectrum in this region.

Figure 10:
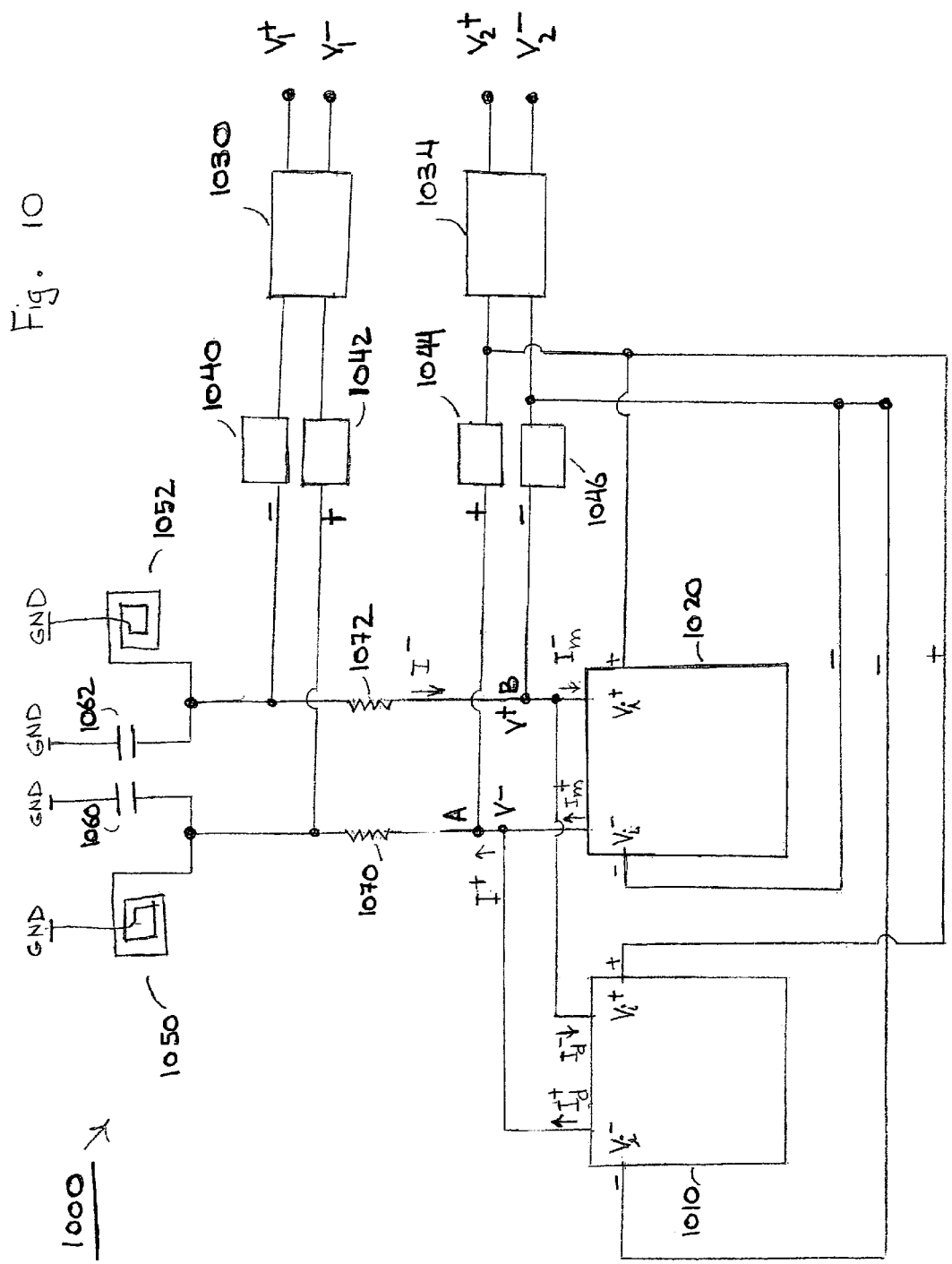
FIG. 10 shows an exemplary implementation of the chaotic HBT circuit of FIG. 3.

FIG. 10 shows an exemplary implementation of the chaotic HBT circuit of FIG. 3. FIGS. 11A, 11B, 11C, and 11D show the internal components of the various elements of FIG. 10.

The HBT circuit 1000 shown in FIG. 10 includes a differential pair 1010, a multiplier 1020, first and second output buffers 1030, 1034, first, second, third, and fourth emitter followers 1040, 1042, 1044, 1046, first and second passive inductors 1050, 1052, first and second capacitors 1060, 1062, and first and second resistors 1070, 1072.

The HBT circuit 1000 is fully autonomous. As such, it does not require any inputs. Each component of the circuit may include local controls in the form of voltages or currents. The HBT circuit 1000 has two pairs of differential outputs $V_1^+$, $V_1^-$ and $V_2^+$, $V_2^-$ that correspond to the first and second waveforms of FIGS. 6A, 6B, 8A, and 8B.

The HBT circuit 1000 is fully differential and, therefore, there are two of each element in this circuit. Fully differential circuits are less sensitive to errors in performance and operate closer to ideal. Particularly at higher frequencies, fully differential circuits provide higher fidelity because they take away the nonlinearities of the signal and are less sensitive to deviation of the various components of the circuit from their nominal values. The HBT circuit 1000 is capable of performing at 2 GHz frequencies as opposed to 160 KHz frequencies typical of prior art.

In one exemplary embodiment, the passive inductors 1050, 1052 may each have an inductance value of 2.501, the capacitors 1060, 1062 may each have a capacitance value of 2.75 pF, and the resistors may each have a resistance value of 130Ω. The differential pair 1010 may include a current source of 1.6 mA and the multiplier 1020 may include a current source of 5.1 mA. The HBT type transistors used in various elements of the HBT circuit 1000 may have cutoff frequencies $F_T$ of 200 GHz. The cutoff frequency determines the speed of operation of the HBT. The current from the current source and the resistors also determine the HBT characteristics.

In the HBT circuit 1000, the differential pair 1010 and the multiplier 1020 both receive positive feedback from outputs of the overall HBT circuit 1000. A positive output of the differential pair 1010 is added to a positive output of the multiplier circuit 1020 and is fed back to the positive input terminals of both of these circuits 1010, 1020. Similarly, negative outputs of the two circuits 1010, 1020 are added together and input to the negative input terminals of both circuits 1010, 1020. Normally negative feedback is added to cause stability in a circuit, while in this case positive feedback is used to implement a negative resistance that is in turn necessary to implement the autonomous chaotic circuit. In short, the positive feedback yields an active implementation of a negative resistance.

The inputs to each of the differential pair and multiplier circuits 1010, 1020 are voltages $Vi^+$ and $Vi^-$ and the outputs from the combination of the circuits 1010, 1020 are currents $I^+$ and $I^-$. Each circuit 1010, 1020 has two inputs and two outputs. The current flowing out at nodes A and B is the output of the combination of the two circuits 1010, 1020 and the output of the overall HBT circuit 1000.

The outputs of the differential pair 1010 and the multiplier circuit 1020 are added together. One differential output plus the other differential output yields the final output. The positive outputs $Id^+$ and $Im^+$ result in $I^+$ that goes through the resistor 1070. The voltage at the first terminal (bottom terminal) of resistor 1070 is used as the input signal for the emitter follower 1044. The voltage at the second terminal (top terminal) of resistor 1070 is used as the input signal for the emitter follower 1042. The negative outputs $Id^-$ and $Im^-$ result in $I^-$ that goes through the resistor 1072. The voltage at the first terminal (bottom terminal) of resistor 1072 is used as the input signal for the emitter follower 1046. The voltage at the second terminal (top terminal) of resistor 1072 is used as the input signal for the emitter follower 1040.

The inductors 1050, 1052 are passive inductors that are implemented using real inductors as opposed to capacitors. The inductors and the capacitors 1060, 1062 form two pairs of parallel LC circuits that are coupled to a reference voltage at one terminal and to the differential outputs of the combination of the differential pair 1010 and the multiplier 1020 at another end. The two parallel LC circuits each form an active LC circuit with a resonance frequency of approximately 2 GHz.

The emitter followers 1040, 1042, 1044, 1046 are used to shift the DC level of their inputs from the combination of the differential pair 1010 and the multiplier 1020. The emitter followers, therefore, operate like a voltage-controlled voltage source. Outputs of the emitter followers are input to the output buffers 1030, 1034 that provide the two sets of differential chaotic output voltages $V_1^+$, $V_1^-$ and $V_2^+$, $V_2^-$ for use in signal processing circuits.

Figure 11A:
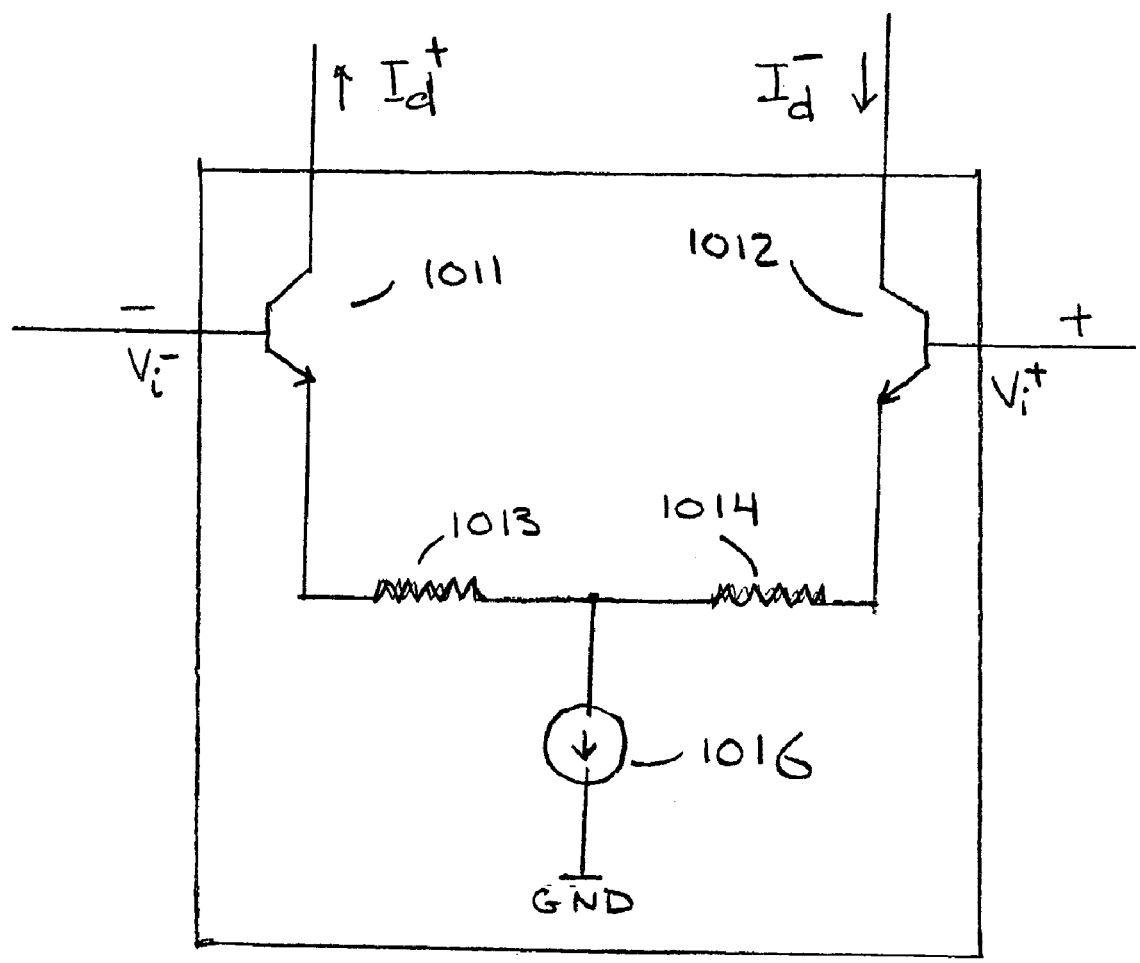
FIG. 11A shows the internal components of a differential pair circuit shown in FIG. 10.

The differential pair circuit 1010 shown in FIG. 11A includes transistors 1011, 1012, internal resistors 1013, 1014, and current source 1016. This current source is a voltage-controlled current source. The control is provided by external bias voltage Va. The two transistors 1011, 1012 are of the HBT type. In one exemplary embodiment, the HBT type transistors 1011, 1012 may have a cut-off frequency $F_T$ of 200 GHz, the two resistors 1013, 1014 may each have a value of 100Ω, and the current source 1016 may produce 1.6 mA.

Figure 11B:
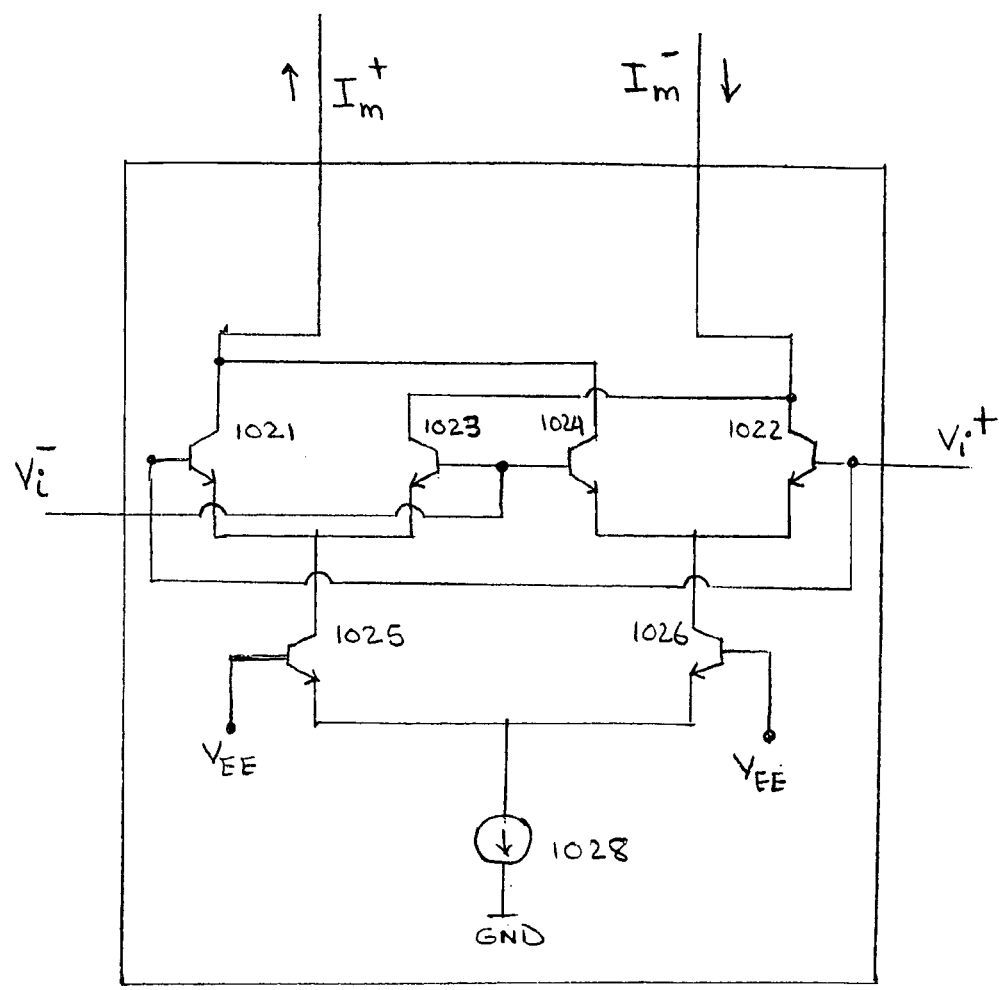
FIG. 11B shows the internal components of a multiplier circuit shown in FIG. 10.

The multiplier circuit 1020 shown in FIG. 11B includes transistors 1021, 1022, 1023, 1024, 1025, and 1026 and current source 1028. In one exemplary embodiment, the transistors may be implemented by HBT type transistors with a cutoff frequency of 200 GHz and the current source may produce 5.1 mA. One exemplary connection between the transistors is shown to produce a multiplier effect. Other multiplier circuits known to those skilled in the art may be used as well.

Figure 11C:
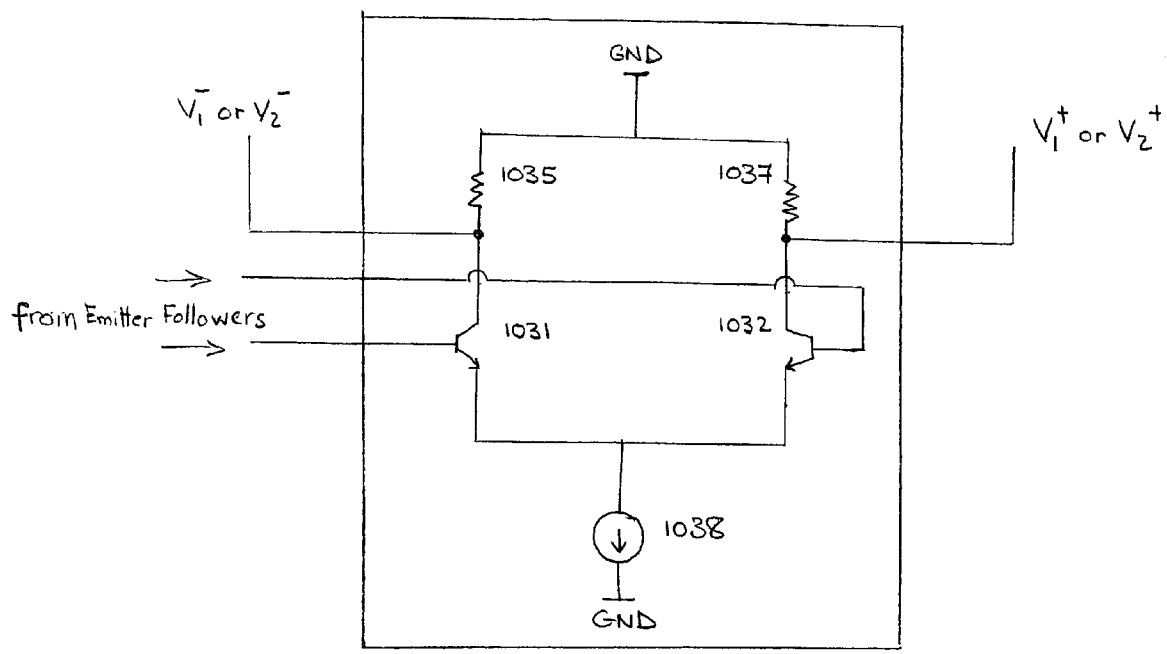
FIG. 11C shows the internal components of an output buffer circuit shown in FIG. 10.

The output buffer circuit 1030 shown in FIG. 11C includes transistors 1031, 1032, resistors 1035, 1037 and the current source 1038 coupled together in a differential configuration. The transistors receive input from the emitter followers and the differential outputs of the circuit are taken at the collectors of the transistors and correspond to the chaotic output voltages of the entire HBT circuit 1000.

The emitter follower circuit 1040 shown in FIG. 11D includes a transistor 1041 coupled to a current source 1042. The circuit 1040 receives its input at the base of the transistor 1041 and the output of the circuit is taken at the emitter. In one exemplary embodiment, the current source may have a value of 3.5 mA.

FIGS. 12A and 12B show the differential voltage versus differential current outputs of the components 1010, 1020 of the chaotic circuit of FIG. 10. FIG. 12C shows the differential voltage versus differential current output for the combination of components 1010 and 1020 in the HBT circuit 1000. The differential corresponds to the positive minus negative current or voltage. In FIG. 12A, current versus voltage curve 1210 shows the differential current $I_d^+-I_d^-$ of the differential circuit 1010 versus the differential voltage $V_i^+-V_i^-$ of this circuit. The curve 1210 is linear in an area about the origin and then saturates as the voltage differential increases in absolute value. In FIG. 12B, current versus voltage curve 1220 shows the differential current $I_m^+-I_m^-$ of the multiplier circuit 1020 versus the differential voltage $V_i^+-V_i^-$ of this circuit. The curve 1220 is linear over all voltage differentials. In FIG. 12C, current versus voltage curve 1230 shows the differential current $I^+-I^-$ of the combination of the differential circuit 1010 and the multiplier 1020, versus the differential voltage $V^+-V^-$ of this combination. The curve 1230 is obtained by adding the curves 1210 and 1220 together. As a result, the curve 1230 has a slope that is equal to the sum of the slopes of the two other curves in the area about the origin and then reduces to the slope of the curve 1220 outside this area where the curve 1210 saturates. As explained regarding FIGS. 3 and 10, the HBT circuit produces two different differential outputs, $V_1^+-V_1^-$ and $V_2^+-V_2^-$, both of which depend on the curve 1230. The slopes of the curves 1210 and 1220, and therefore the resulting slopes of the curve 1230, may be changed by control signals controlling the differential circuit 1010 and the multiplier circuit 1020. The slope around the origin may be changed by a large factor by controlling the multiplier circuit 1020 alone.

Figure 13:
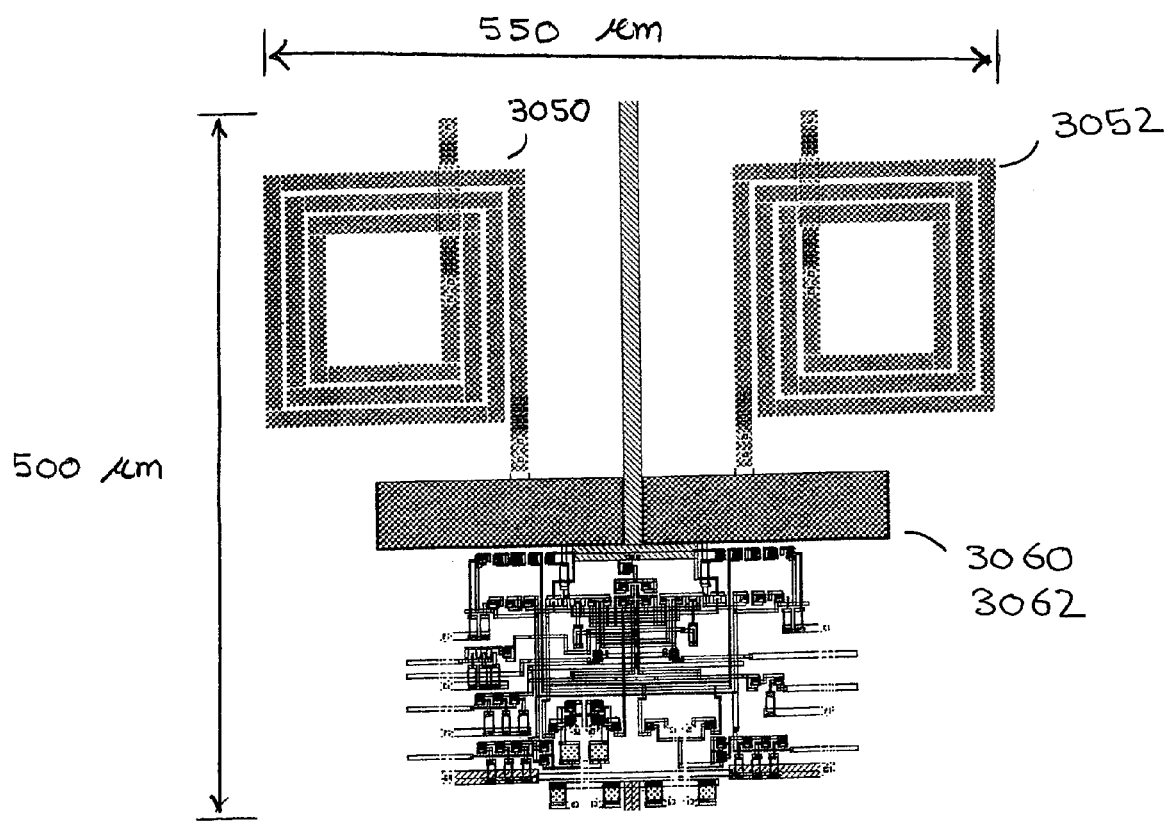
FIG. 13 shows dimensions of a chip including the HBT circuit of FIG. 10.

FIG. 13 shows dimensions of a chip 1300 including the HBT circuit of FIG. 10. The elements of the chip 1300 correspond to the elements of the HBT circuit 1000. While many chips have dimensions of several millimeters, the HBT circuit 1000 is approximately 550 μm by 500 μm. As FIG. 13 shows, most of the area of the chip 1300 is occupied by two passive inductors 3050, 3052 that correspond to the passive inductors 1050 and 1052 of FIG. 10 and by capacitors 3060, 3062 that correspond to the capacitors 1060, 1062 of FIG. 10. In comparison, the remainder of the circuit does not occupy an appreciable area.

Figure 14A:
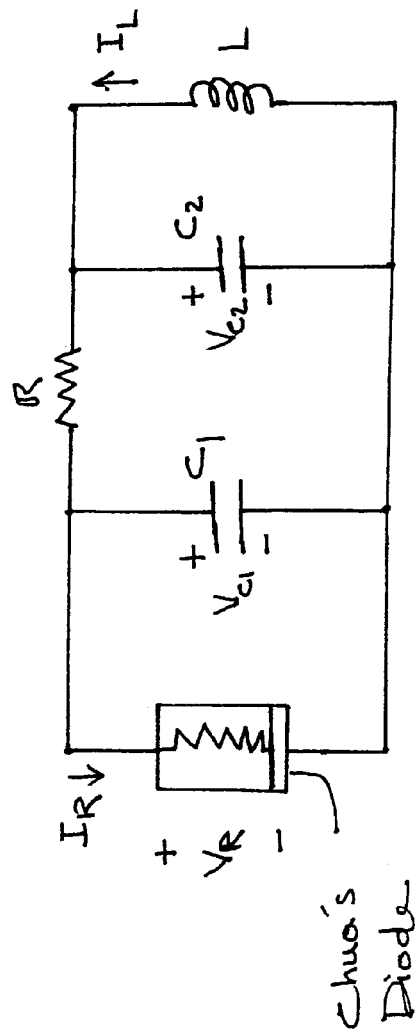
FIG. 14A shows the prior art Chua's circuit.
Figure 14B:
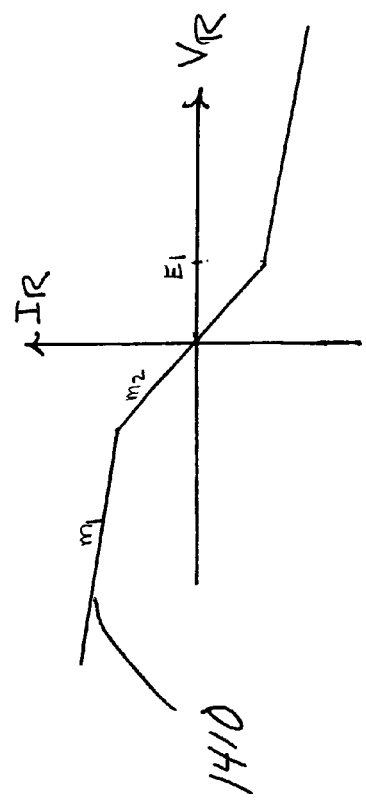
FIG. 14B shows the voltage versus current characteristics curve of Chua's diode used in the Chua's circuit of FIG. 14A.

FIG. 14A shows the prior art circuit of Chua 1400. FIG. 14B shows the current versus voltage characteristics curve 1410 of a Chua's diode that is used in the circuit 1400. The Chua's circuit 1400 of FIG. 14A generates a chaotic signal as does the HBT circuit 1000 of FIG. 10. Chua's circuit 1400 includes a Chua's diode coupled in parallel with a first capacitor C1, an inductor L coupled in parallel with a second capacitor C2 and a resistor R that is coupled between the parallel connection of the L and C2 and the parallel connection of the diode and C1. The Chua's diode may be implemented by using a combination of op-amps, resistors, diodes, or discrete bipolar transistors. The Chua's diode is the non-linear element of the Chua's circuit that yields the nonlinear response shown in the current $I_R$ versus voltage $V_R$ curve 1410. The output characteristic curve 1410 of the Chua's diode shows a larger slope around the origin and the slope decreases further away from the origin.

The Chua's circuit 1400 is a third order circuit. The three variables are the voltages across the capacitors C1 and C2 and the current through the inductor L. A particular Chua's circuit is characterized by seven parameters C1, C2, L, R, E1, m1, and m2. E1 is the voltage breakpoint between the two slopes m1 and m2 on the curve 1410. In one implementation, the area occupied by the Chua's circuit is 2.5 mm×2.8 mm and the resonant frequency of the active LC circuit is approximately 160 KHz. The inductor L is emulated by a capacitor and is not a passive inductor. Chua's circuit is the simplest autonomous circuit that can exhibit bifurcation and chaos.

The HBT circuit 1000 may be considered as a fully differential implementation of Chua's circuit 1400, where C2 is implemented by the capacitors 1060, 1062, the inductor L is implemented by the inductors 1050, 1052, the Chua's diode is implemented by the positive feedback connection of the differential pair 1010 and the multiplier 1020, and C1 is implemented by the parasitic capacitances of the transistors within the circuits 1010, 1020. Both Chua's circuit 1400 and the HBT circuit 1000 are autonomous and do not require any inputs. However, both circuits require controls, such as DC voltages.

However, unlike the HBT circuit 1000 that is fully differential, Chua's circuit 1400 is single-ended. Further, Chua's diode in the circuit 1400 of FIG. 14A has been implemented using CMOS transistors while some or all of the transistors in the HBT circuit 1000 are HBT and Chua's circuit operates at about 160 KHz while the HBT circuit 1000 has a resonance frequency of 2 GHz. For a CMOS implementation of the Chua's circuit see J. Cruz et al. "A CMOS IC Nonlinear Resistor for Chua's Circuit" IEEE Trans. on Circuits and Systems, vo. 39, no. 12, pp. 985-995, December 1992, that is incorporated herein by reference. As a result, the inductor of Chua is implemented as an active circuit using transistors and capacitors, unlike the passive inductors that are used in the HBT circuit 1000. Emulating the inductors by active circuits composed of transistors slows down the circuit at high frequencies. The faster the frequency of operation, the smaller the inductance value and the smaller the area of the inductor. In the old implementations operating at slower frequencies, a passive inductor would have occupied a large area. Therefore, due to the limitations of the CMOS implementations of the autonomous chaotic circuits at high frequencies, these circuits could not use integrated passive inductors as shown in J. Cruz et al. "An IC Chip of Chua's Circuit" IEEE Trans on Circuits and Systems, Part II, vol. 40, no. 10, pp. 614-625, October 1993, that is incorporated herein by reference.

As described above, embodiments of the present invention are directed to using a chaotic signal for modulating communication waveforms. Chaotic signals can not be replicated by pre-loading a pre-determined sequence. Also, it is impossible to generate identical chaotic signals at the transmitter and receiver sites. Before the present invention, it was thought that chaotic signals could not be used in communications. The use of chaotic signals for the purpose of truly securing a communication, therefore, has not been contemplated in the art.

Although the present invention has been described with reference to certain exemplary embodiments, it is understood that a variety of modifications and variations may be made to the present invention without departing from the spirit or scope of the invention defined in the appended claims, and their equivalents.

What is claimed is:

1. An autonomous chaotic circuit having a first pair of circuit output terminals and a second pair of circuit output terminals and being fully differential, the autonomous chaotic circuit comprising:

a first circuit having a pair of first input terminals and a pair of first output terminals, the pair of first input terminals coupled to the first pair of circuit output terminals in a positive feedback configuration;

a multiplier circuit coupled to the first circuit in a positive feedback configuration, the multiplier circuit having a pair of multiplier input terminals and a pair of multiplier output terminals, the pair of multiplier input terminals being coupled to the pair of first input terminals, and the pair of multiplier output terminals being coupled to the pair of first output terminals forming a first pair of common output terminals including a first common output terminal and a second common output terminal;

a first LC circuit having a first inductor coupled to a first capacitor in parallel, the first LC circuit being coupled to a reference voltage at one terminal;

a second LC circuit having a second inductor coupled to a second capacitor in parallel, the second LC circuit being coupled to the reference voltage at one terminal;

a first resistor coupled between the first LC circuit and the first common output terminal, a node between the first resistor and the first LC circuit being a third common output terminal; and a second resistor coupled between the second LC circuit and the second common output terminal, a node between the second resistor and the second LC circuit being a fourth common output terminal, the third common output terminal and the fourth common output terminal forming a second pair of common output terminals;

wherein the first circuit and the multiplier circuit are implemented using HBT, and wherein the first inductor, the second inductor, the first capacitor, and the second capacitor are implemented by passive inductors and passive capacitors.

2. The autonomous chaotic circuit of claim 1, further comprising:

a first pair of emitter followers coupled to the first pair of common output terminals;

a second pair of emitter followers coupled to the second pair of common output terminals;

a first output buffer coupled to the first pair of emitter followers; and a second output buffer coupled to the second pair of emitter followers, wherein the first pair of emitter followers, the second pair of emitter followers, the first output buffer, and the second output buffer are implemented using HBT.

3. The autonomous chaotic circuit of claim 1, wherein the first circuit includes:

a pair of first circuit transistors each having an emitter, a collector, and a base;

a pair of first circuit resistors coupled in a differential configuration to the pair of first circuit transistors, two transistors in the pair of first circuit transistors each being coupled between a first node and an emitter of one of the transistors in the pair of first circuit transistors; and a first circuit current source coupled to the first node, wherein each first input terminal in the pair of first input terminals is coupled to a base of one of the two transistors in the pair of first circuit transistors, and wherein each first output terminal in the pair of first output terminals is coupled to a collector of one of the two transistors in the pair of first circuit transistors.

4. The autonomous chaotic circuit of claim 1, wherein the HBT transistors implementing first circuit and the multiplier circuit have a cutoff frequency of substantially 200 GHz, wherein the first resistor and the second resistor each have a resistance of substantially 130Ω, wherein the first inductor and the second inductor each have an inductance of substantially 2.5 μH, wherein the first capacitor and the second capacitor each have a capacitance of substantially 2.75 pF, wherein the first circuit includes a current source producing a current of substantially 1.6 mA, and wherein the multiplier circuit includes a current source producing a current of substantially 5.1 mA.

5. The autonomous chaotic circuit of claim 1, wherein the autonomous chaotic circuit has a first differential pair of circuit output voltages at the first pair of circuit output terminals and a second differential pair of circuit output voltages at the second pair of circuit output terminals, wherein the first circuit is receiving the first differential pair of circuit output voltages at the first input terminals and providing a differential pair of first currents at the first output terminals, wherein the multiplier circuit is receiving the first differential pair of circuit output voltages at the multiplier input terminals and providing a differential pair of multiplier currents at the multiplier output terminals, and wherein the differential pair of first currents and the differential pair of multiplier currents are added together at the first pair of common output terminals.

6. A method for autonomous and differential generation of a pair of chaotic signals, the method comprising:

generating a differential pair of currents by supplying a differential control voltage and positive feed back to a negative resistance circuit, the negative resistance circuit implementing a negative resistance and having nonlinear input-output characteristics;

generating resonance by providing the differential pair of currents to a pair of parallel LC circuits through a pair of resistors;

obtaining a first chaotic signal from a differential pair of voltages output by the negative resistance circuit at nodes before the pair of resistors; and obtaining a second chaotic signal from the differential pair of voltages output by the negative resistance circuit at nodes after the pair of resistors, wherein the negative resistance circuit includes a parasitic capacitance, and wherein the resonance generated is substantially in the GHz range.

7. The method of claim 6, wherein the pair of parallel LC circuits are implemented using passive inductors and passive capacitors.

* * * * *